US012469771B2

(12) United States Patent
Nakamura

(10) Patent No.: US 12,469,771 B2
(45) Date of Patent: Nov. 11, 2025

(54) SEMICONDUCTOR DEVICE WITH SEALING RESIN OVER CHIP AND LEAD FRAME

(71) Applicant: FUJI ELECTRIC CO., LTD., Kanagawa (JP)

(72) Inventor: Kenpei Nakamura, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 604 days.

(21) Appl. No.: 17/728,950

(22) Filed: Apr. 25, 2022

(65) Prior Publication Data
US 2022/0399253 A1 Dec. 15, 2022

(30) Foreign Application Priority Data
Jun. 15, 2021 (JP) .................. 2021-099549

(51) Int. Cl.
*H01L 23/495* (2006.01)
*H01L 23/00* (2006.01)

(52) U.S. Cl.
CPC .. *H01L 23/49513* (2013.01); *H01L 23/49562* (2013.01); *H01L 24/48* (2013.01); *H01L 2224/48245* (2013.01); *H01L 2924/1815* (2013.01); *H01L 2924/182* (2013.01); *H01L 2924/186* (2013.01)

(58) Field of Classification Search
CPC ......... H01L 23/49513; H01L 23/49562; H01L 24/48; H01L 2224/48245; H01L 2924/1815; H01L 2924/182; H01L 2924/186
See application file for complete search history.

(56) References Cited

U.S. PATENT DOCUMENTS 9,831,158 B2 * 11/2017 Hayashi ................ H01L 24/97
2009/0250795 A1 10/2009 Hooper
(Continued)

FOREIGN PATENT DOCUMENTS

JP H0637122 A 2/1994
JP H11145363 A 5/1999
(Continued)

OTHER PUBLICATIONS

Office Action issued for counterpart Japanese Application No. 2021-099549, transmitted from the Japanese Patent Office on Feb. 4, 2025 (drafted on Jan. 27, 2025).
(Continued)

*Primary Examiner* — Ratisha Mehta
*Assistant Examiner* — Timothy Edward Duren

(57) ABSTRACT

Provided is a semiconductor device including: a lead frame having an upper surface provided with a concave portion and a lower surface provided with a convex portion; a semiconductor chip fixed to the upper surface of the lead frame; a solder layer provided in the concave portion and fixing the semiconductor chip to the upper surface of the lead frame; and a sealing resin for sealing the semiconductor chip and the lead frame. A thickness of the solder layer is larger than a depth of the concave portion. The sealing resin covers at least a part of the lower surface of the lead frame. At least a part of the convex portion of the lead frame is exposed from the sealing resin.

23 Claims, 14 Drawing Sheets

(56) References Cited

U.S. PATENT DOCUMENTS

| | | | | |
|---|---|---|---|---|
| 2010/0006995 | A1* | 1/2010 | Kasuya | H01L 23/3114 |
| | | | | 257/676 |
| 2013/0009299 | A1 | 1/2013 | Takada | |
| 2014/0353800 | A1 | 12/2014 | Guillorn et al. | |
| 2014/0353809 | A1* | 12/2014 | Shimizu | H01L 24/97 |
| | | | | 257/676 |
| 2015/0294870 | A1* | 10/2015 | Fujisawa | H01L 21/52 |
| | | | | 438/123 |
| 2017/0213788 | A1 | 7/2017 | Shimanuki | |

FOREIGN PATENT DOCUMENTS

| | | | |
|---|---|---|---|
| JP | 2008034601 A | | 2/2008 |
| JP | 2011517113 A | | 5/2011 |
| JP | 3170627 U | | 9/2011 |
| JP | 2012104709 A | | 5/2012 |
| JP | 2013016624 A | | 1/2013 |
| JP | 2014175615 A | * | 9/2014 |
| JP | 2014232811 A | | 12/2014 |
| JP | 2015032765 A | | 2/2015 |
| JP | 2015043380 A | | 3/2015 |
| JP | 2017135230 A | | 8/2017 |
| JP | 2018174232 A | | 11/2018 |
| KR | 20100063992 A | * | 6/2010 ............. H01L 23/48 |

OTHER PUBLICATIONS

Office Action issued for counterpart Japanese Application No. 2021-099549, transmitted from the Japanese Patent Office on Jul. 1, 2025 (drafted on Jun. 25, 2025).

* cited by examiner

US 12,469,771 B2

SEMICONDUCTOR DEVICE WITH SEALING RESIN OVER CHIP AND LEAD FRAME

The contents of the following Japanese patent application are incorporated herein by reference:
NO. 2021-099549 filed in JP on Jun. 15, 2021.

BACKGROUND

1. TECHNICAL FIELD

The present invention relates to a semiconductor device.

2. RELATED ART

Conventionally, in a semiconductor device, a structure in which a semiconductor chip is fixed on a die pad or the like of a lead frame by a fixing portion such as solder is known (see, for example, Patent Documents 1 to 3). The related prior art documents are as follows (see Patent Documents 4 to 6).

Patent Document 1: Japanese Patent Application Publication No. 2018-174232
Patent Document 2: Japanese Patent Application Publication No. 2015-43380
Patent Document 3: Japanese Patent Application Publication No. 2017-135230
Patent Document 4: Japanese Patent Application Publication No. 2008-34601
Patent Document 5: Japanese Patent Application Publication No. 2014-232811
Patent Document 6: Japanese Patent Application Publication No. 11-145363

According to the present invention a semiconductor device comprising a lead frame having an upper surface provided with a concave portion and a lower surface provided with a convex portion. A semiconductor chip fixed to the upper surface of the lead frame. A solder layer provided in the concave portion and fixing the semiconductor chip to the upper surface of the lead frame. A sealing resin for sealing the semiconductor chip and the lead frame. A thickness of the solder layer is larger than a depth of the concave portion. The sealing resin covers at least a part of the lower surface of the lead frame. At least a part of the convex portion of the lead frame is exposed from the sealing resin.

DESCRIPTION OF EXEMPLARY EMBODIMENTS

Hereinafter, the present invention will be described through embodiments of the invention, but the following embodiments do not limit the invention according to the claims. Not all combinations of features described in the embodiments are essential to the solution of the invention.

As used herein, one side in a direction parallel to a thickness direction of a semiconductor chip is referred to as "upper" and the other side is referred to as "lower". One of two main surfaces of a substrate, a lead frame or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. The Z axis direction described without positive or negative sign means a direction parallel to the +Z axis and the Z axis. In the present specification, a thickness direction of the semiconductor chip is defined as a Z axis direction, and a plane parallel to an upper surface of the semiconductor chip is defined as an XY plane. Note that the X axis direction and the Y axis direction are parallel to any of the end sides of the upper surface of the semiconductor chip.

Figure 1:
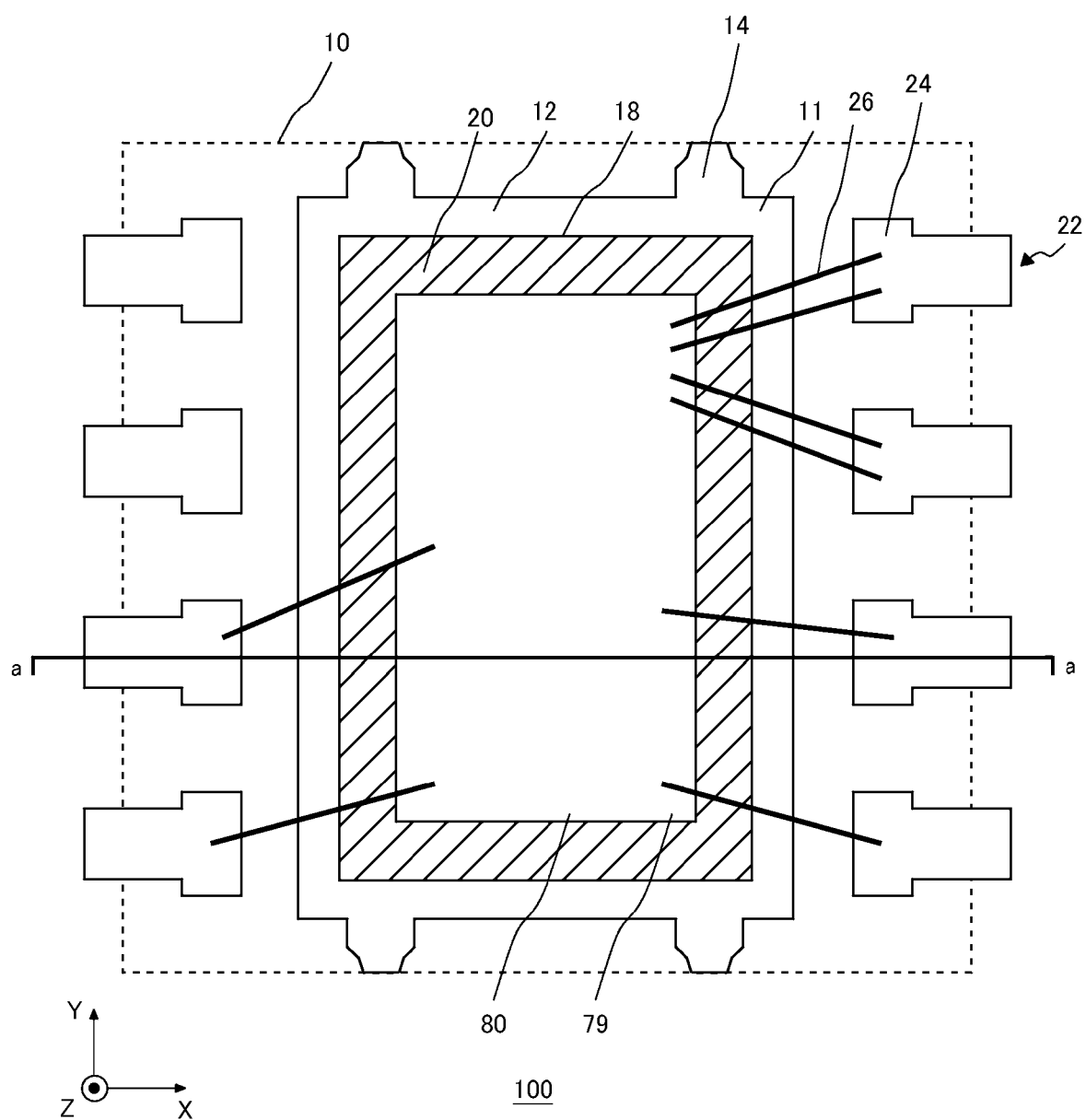
FIG. 1 is a top view illustrating an example of a semiconductor device 100 according to one embodiment of the present invention.

FIG. 1 is a top view illustrating an example of a semiconductor device 100 according to one embodiment of the present invention. The semiconductor device 100 includes a semiconductor chip 80. The semiconductor chip 80 is a chip in which a semiconductor device such as a transistor or a diode is formed on a semiconductor substrate such as silicon. The semiconductor device may be a power semiconductor device such as an insulated gate bipolar transistor (IGBT) or a power MOSFET. FIG. 1 illustrates an arrangement example of each member in an XY plane parallel to an upper surface 79 of the semiconductor chip 80. Although the semiconductor device 100 of the present example includes one semiconductor chip 80, the number of semiconductor chips 80 included in the semiconductor device 100 may be two or more. The semiconductor device 100 is an intelligent power switch as an example The semiconductor device 100 includes a lead frame to which the semiconductor chip 80 is fixed. The semiconductor device 100 of the present example includes a lead frame 12 to which one semiconductor chip 80 is fixed.

The lead frame 12 is formed of aluminum, copper, or another metal material. The lead frame 12 may have a plate shape. The plate shape refers to a shape in which each area of two opposing main surfaces (an upper surface 11 and a lower surface 13 (see FIG. 2)) is larger than the area of each side surface sandwiched between the two main surfaces.

In the present example, the lead frame 12 has a protrusion 14. The protrusion 14 protrudes in the Y axis direction in a top view. The protrusion 14 may be provided so as not to face an external terminal 22. The lead frame 12 may not have the protrusion 14.

The lead frame 12 may be electrically connected to the corresponding semiconductor chip 80. For example, a lower surface 81 (see FIG. 2) of the semiconductor chip 80 and the lead frame 12 are electrically connected by a solder layer 20. In addition, the lead frame 12 may be electrically connected to the upper surface 79 of the corresponding semiconductor chip 80 by a wire 26 or the like. Pads such as an emitter pad, a collector pad, and a gate pad are provided in the upper surface 79 and the lower surface 81 of the semiconductor chip 80, for example.

The external terminal 22 is a terminal to which the semiconductor chip 80 is not fixed. Each of the external terminals 22 is provided separately from the other external terminals 22. The external terminal 22 may be electrically connected to the upper surface 79 of the semiconductor chip 80. The external terminal 22 may be electrically connected to the upper surface 79 of the semiconductor chip 80 by the wire 26 or the like. In the present example, the external terminal 22 has a protrusion 24. The protrusion 24 protrudes in the Y axis direction in a top view.

The semiconductor device 100 of the present example includes a sealing resin 10 that seals the semiconductor chip 80 and the lead frame 12. The sealing resin 10 is, as an example, an insulating material such as an epoxy resin. The end portion of each external terminal 22 may be exposed to the outside of the sealing resin 10. The sealing resin 10 is formed by transfer molding as an example. Providing the sealing resin 10 allows the semiconductor chip 80 and the lead frame 12 to be protected. In the present specification, the boundary with respect to the outside of the sealing resin 10 is indicated by a dotted line, and the inside of the sealing resin 10 is indicated transparently.

The semiconductor chip 80 is fixed to the upper surface 11 of the lead frame 12. The semiconductor chip 80 is fixed to the upper surface 11 of the lead frame 12 by the solder layer 20. The solder layer 20 may be a known material such as lead solder or lead-free solder. A concave portion 18 is provided in the upper surface 11 of the lead frame 12. The concave portion 18 is a region recessed from the upper surface 11 of the lead frame 12 toward the lower surface 13 side.

In a top view from a direction perpendicular to the upper surface 11 of the lead frame 12, the concave portion 18 and the semiconductor chip 80 of the present example have a rectangular shape. One side of the concave portion 18 and the semiconductor chip 80 is parallel to the X axis, and the other side is parallel to the Y axis.

Figure 2:
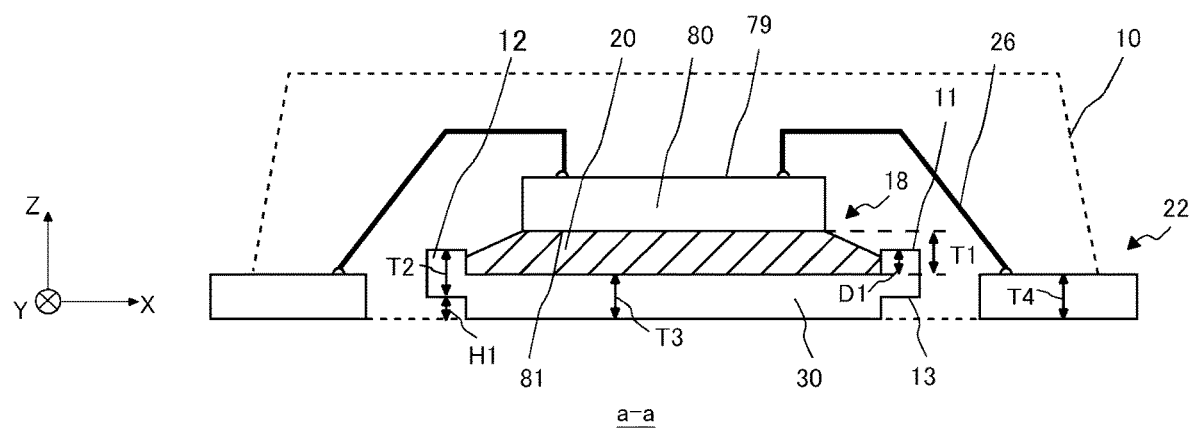
FIG. 2 is a diagram illustrating an example of the semiconductor device 100 in a cross section a-a.

FIG. 2 is a diagram illustrating an example of the semiconductor device 100 in a cross section a-a. The cross section a-a is a cross section in the XZ plane. In this cross section, the semiconductor device 100 includes the sealing resin 10, the lead frame 12, the solder layer 20, the external terminal 22, the wire 26, and the semiconductor chip 80. Note that the wire 26 is illustrated by projecting the entire member on the XZ plane.

The lead frame 12 has the concave portion 18 and a convex portion 30. The concave portion 18 is a region recessed toward the lower surface 13 side in the upper surface 11 of the lead frame 12. The convex portion 30 is provided at a position facing the concave portion 18 in the lower surface 13 on the opposite side to the upper surface 11 of the lead frame 12. The convex portion 30 protrudes downward from the lower surface 13 of the lead frame 12 in the lower surface 13 on the opposite side to the upper surface 11 of the lead frame 12. The concave portion 18 and the convex portion 30 are provided by half-punching the lead frame 12.

When the lead frame 12 is half-punched, the shape of the concave portion 18 can be controlled by the shape of a pressing member. The shape of the convex portion 30 can also be controlled by disposing a mold corresponding to the shape of the convex portion 30 to be formed on the lower surface 13 side of the lead frame 12. When the mold is not disposed on the lower surface 13 side of the lead frame 12, the shape of the convex portion 30 is substantially the same as the shape of the concave portion 18. In the present specification, since the concave portion 18 and the convex portion 30 are provided without disposing a mold on the lower surface 13 side of the lead frame 12, the shape of the convex portion 30 and the shape of the concave portion 18 are substantially the same.

The fact that the concave portion 18 and the convex portion 30 face each other means that at least a part of the region where the concave portion 18 is provided and at least a part of the region where the convex portion 30 is provided overlap each other in a top view from a direction perpendicular to the upper surface 11 of the lead frame 12. Half or more of the region where the convex portion 30 is provided may overlap the region where the concave portion 18 is provided, and the entire region where the convex portion 30 is provided may overlap the region where the concave portion 18 is provided. Half or more of the region where the concave portion 18 is provided may overlap the region where the convex portion 30 is provided, and the entire region where the concave portion 18 is provided may overlap the region where the convex portion 30 is provided. The region where the concave portion 18 is provided and the region where the convex portion 30 is provided may coincide with each other. In the present specification, the region where the concave portion 18 is provided and the region where the convex portion 30 is provided substantially coincide with each other in a top view.

The solder layer 20 is provided in the concave portion 18. In FIG. 2, the solder layer 20 is provided on the bottom surface of the concave portion 18. The solder layer 20 may be provided in the entire bottom surface of the concave portion 18. The bottom surface of the concave portion 18 may refer to a surface parallel to the lower surface 81 of the semiconductor chip 80 among the inner surfaces of the concave portion 18. The lower surface 81 of the semiconductor chip 80 is fixed to the bottom surface of the concave portion 18 by the solder layer 20.

Providing the solder layer 20 inside the concave portion 18 allows spreading of the solder layer 20 to be stopped inside the concave portion 18. Therefore, in the semiconductor device 100, the thickness of the solder layer 20 can be increased. In order to increase the thickness of the solder layer 20, it is not necessary to increase the lead frame 12, and the semiconductor device 100 can be downsized. In the present specification, the thickness is a difference in height between the upper surface and the lower surface in the Z axis direction.

Providing the solder layer 20 inside the concave portion 18 also allows variations in the thickness of the solder layer 20 to be reduced. Reducing the variation in the thickness of the solder layer 20 allows the inclination amount of the semiconductor chip 80 to be reduced, and a connection failure with the wire 26 to be reduced. Therefore, the reliability of the semiconductor device 100 can be improved.

Providing the concave portion 18 in the lead frame 12 allows the concave portion 18 to be filled with the sealing resin 10. Therefore, it is possible to suppress deformation of the sealing resin 10 at the time of a change in cold temperature. Therefore, the reliability at the time of a change in cold temperature can be improved. Therefore, the semiconductor device 100 can improve a reliable capability to a change in cold temperature.

In the present example, a thickness T1 of the solder layer 20 is larger than a depth D1 of the concave portion 18. The thickness T1 of the solder layer 20 may be a maximum thickness of the solder layer 20. The depth D1 of the concave portion 18 may be a maximum depth of the concave portion 18. Therefore, at least a part of the solder layer 20 is provided above the lead frame 12 in the height direction (Z axis direction). Therefore, the entire semiconductor chip 80 can be provided above the lead frame 12 in the height direction, and the entire semiconductor chip 80 can be easily visually recognized Therefore, the appearance inspection is easily performed, and the appearance defect is easily found by the appearance inspection.

The thickness of the lead frame 12 in the region where the convex portion 30 is not provided is defined as T2. The thickness T2 of the lead frame 12 is 0.25 mm or less as an example The thickness of the lead frame 12 in the region where the convex portion 30 is provided is defined as T3. The thickness T3 of the lead frame 12 is 0.25 mm or less as an example. The thickness T2 of the lead frame 12 and the thickness T3 of the lead frame 12 may be the same. The case where the depth and the height are the same also includes a case where the error is within 10%. The depth D1 of the concave portion 18 may be 0.125 mm or less. The thickness T1 of the solder layer 20 may be 0.15 mm or more. The thickness T1 of the solder layer 20 may be 0.20 mm or less.

In the present example, the sealing resin 10 covers at least a part of the lower surface 13 of the lead frame 12. The sealing resin 10 covers the lower surface 13 of the lead frame 12 where the convex portion 30 is not provided. In FIG. 2, the sealing resin 10 covers the outer peripheral side of the lower surface 13 of the lead frame 12. The outer peripheral side of the lower surface 13 of the lead frame 12 is an outermost portion in the lower surface 13 of the lead frame 12 in a top view. Therefore, the sealing resin 10 can be provided in the vicinity of the outer peripheral side of the lower surface 13 of the lead frame 12, and peeling of the sealing resin 10 from the semiconductor chip 80 or the solder layer 20 due to a mold lock can be prevented. The sealing resin 10 can be provided in the vicinity of the outer peripheral side of the lower surface 13 of the lead frame 12, and defects such as cracks due to stress concentration in the vicinity of the outer peripheral side of the lower surface 13 of the lead frame 12 can be reduced.

In the present example, at least a part of the lower surface 13 of the lead frame 12 is exposed from the sealing resin 10. In FIG. 2, at least a part of the convex portion 30 of the lead frame 12 is exposed from the sealing resin 10. Since the at least a part is exposed from the sealing resin 10, heat can be efficiently dissipated from the semiconductor chip 80. Therefore, the semiconductor device 100 can improve a reliable capability to a change in cold temperature.

The external terminal 22 is provided at a position lower than the semiconductor chip 80 in the height direction. Since the thickness of the solder layer 20 can be increased, the semiconductor chip 80 can be provided at a position higher than the external terminal 22. Therefore, the appearance inspection of the semiconductor chip 80 is easily performed, and the appearance defect is easily found by the appearance inspection. That is, a height T4 of the external terminal 22 may be smaller than the sum of the thickness T3 of the lead frame 12 and the thickness T1 of the solder layer 20.

A height H1 of the convex portion 30 may be equal to or less than the depth D1 of the concave portion 18. The height H1 of the convex portion 30 refers to the height in the height direction (Z axis direction) from the lower surface 13 of the lead frame 12 to the lower end of the convex portion 30. Therefore, the height H1 of the convex portion 30 may be 0.125 mm or less. The height H1 of the convex portion 30 may be equal to or more than the depth D1 of the concave portion 18. The height H1 of the convex portion 30 may be the same as the depth D1 of the concave portion 18. Since the concave portion 18 and the convex portion 30 are provided by half-punching, the height H1 of the convex portion 30 and the depth D1 of the concave portion 18 can be controlled by appropriately changing the mold corresponding to the shape of the pressing member or the convex portion 30 to be formed.

Figure 3:
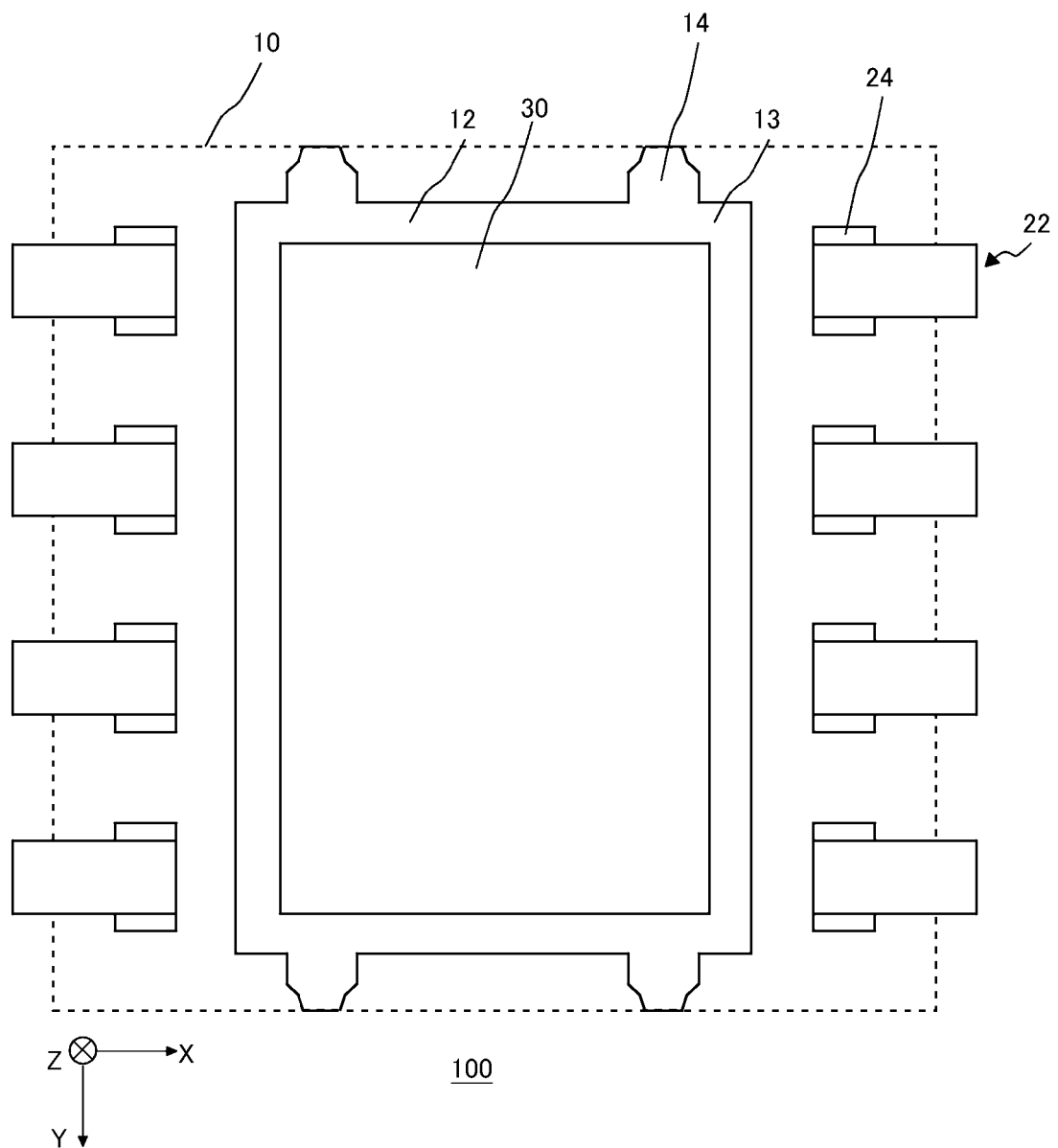
FIG. 3 is a bottom view illustrating an example of the semiconductor device 100.

FIG. 3 is a bottom view illustrating an example of the semiconductor device 100. FIG. 3 illustrates an arrangement example of each member in the XY plane. Unlike FIG. 1, FIG. 3 illustrates the arrangement of the convex portions 30. In the present example, the shape of the convex portion 30 is the same as the shape of the concave portion 18 of FIG. 1.

Figure 4:
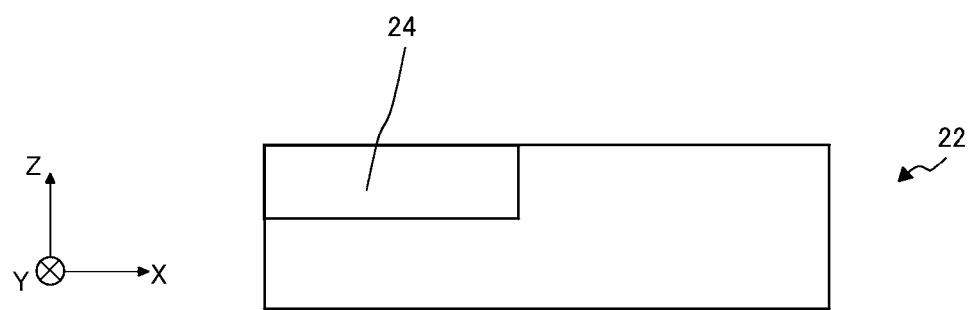
FIG. 4 is a side view illustrating an example of an external terminal 22.

FIG. 4 is a side view illustrating an example of the external terminal 22. As illustrated in FIG. 4, the sealing resin 10 can be provided below the protrusion 24 of the external terminal 22. Therefore, deformation of the external terminal 22 can be suppressed. Therefore, defects such as cracks due to stress concentration in the external terminal 22 can be reduced.

Figure 5:
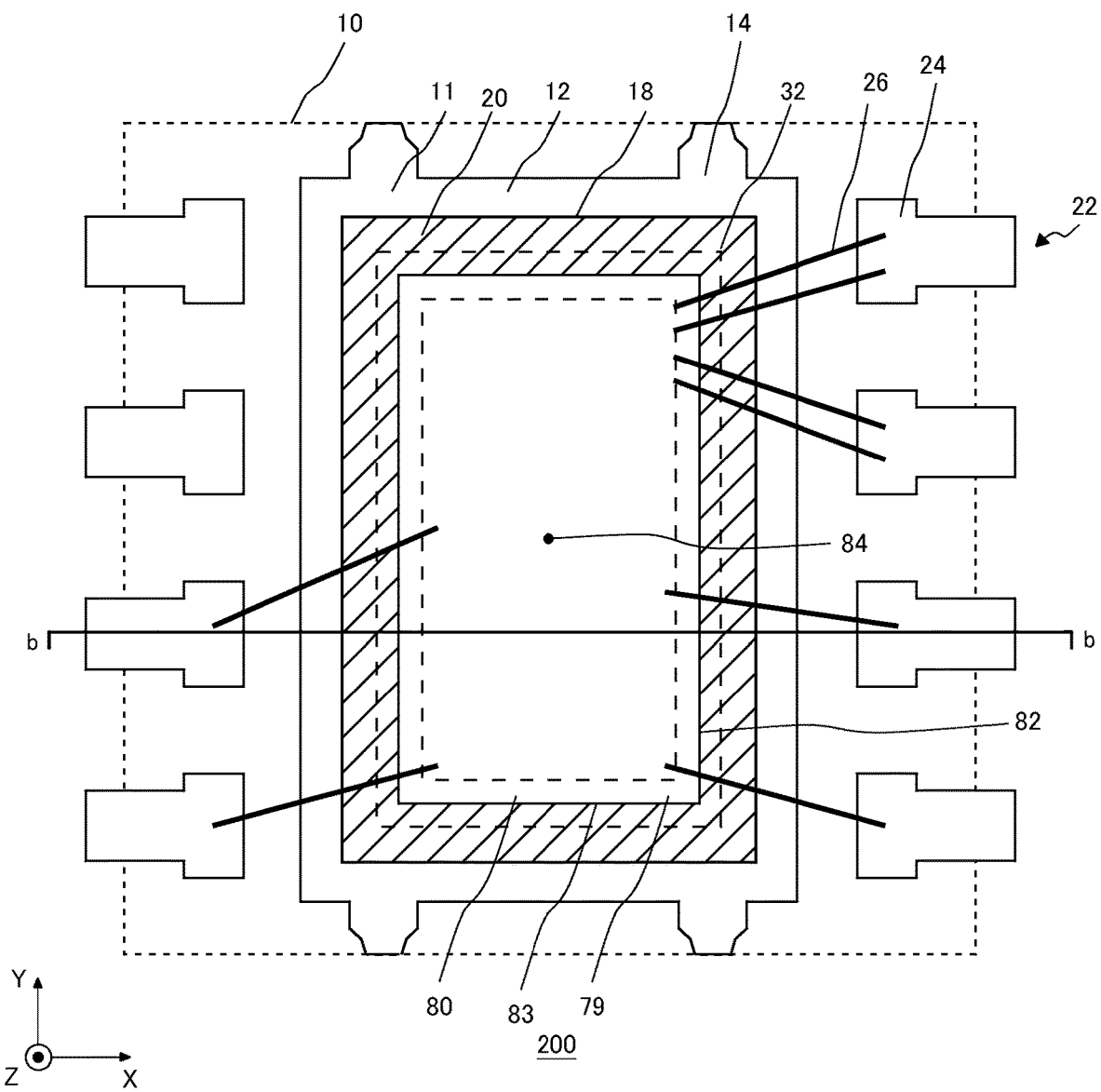
FIG. 5 is a top view illustrating an example of a semiconductor device 200 according to another embodiment of the present invention.
Figure 6:
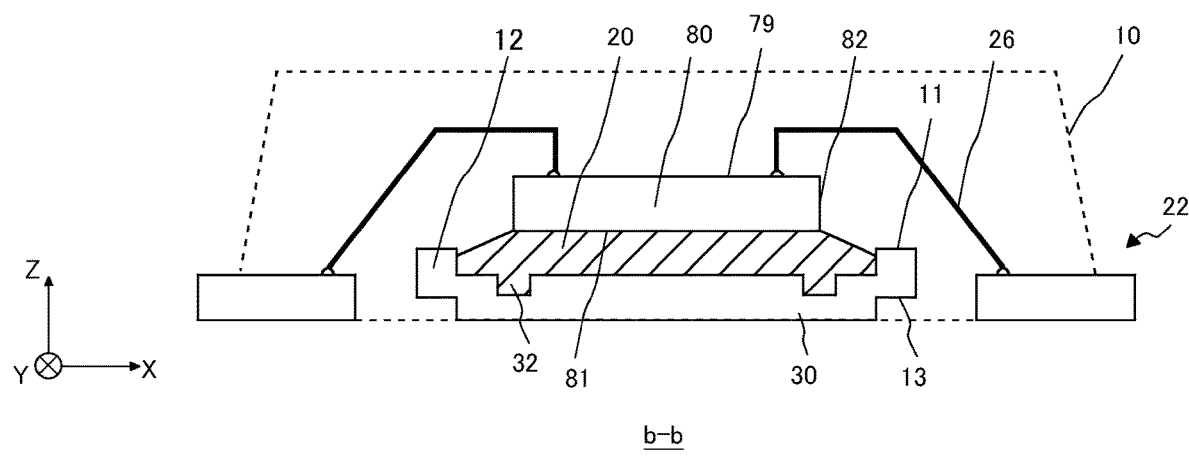
FIG. 6 is a diagram illustrating an example of the semiconductor device 200 in a cross section b-b.

FIG. 5 is a top view illustrating an example of a semiconductor device 200 according to another embodiment of the present invention. FIG. 6 is a diagram illustrating an example of the semiconductor device 200 in a cross section b-b. The semiconductor device 200 is different from the semiconductor device 100 in that the concave portion 18 has a groove 32. The other configurations of the semiconductor device 200 may be the same as those of the semiconductor device 100. In FIG. 5, the groove 32 is indicated by a dotted line.

The concave portion 18 has the groove 32. The groove 32 is a portion where the depth of the concave portion 18 is deeper. In FIG. 6, the groove 32 is provided immediately below an end portion 82 and an end portion 83 of the semiconductor chip 80. The end portion 82 of the semiconductor chip 80 is an end portion of the semiconductor chip 80 in the X axis direction. The end portion 83 of the semiconductor chip 80 is an end portion of the semiconductor chip 80 in the Y axis direction. In the end portion 82 and the end portion 83 of the semiconductor chip 80, stress is likely to concentrate on the solder layer 20. Providing the groove 32 immediately below the end portion 82 and the end portion 83 of the semiconductor chip 80 allows the thickness of the solder layer 20 in the vicinity of the end portion 82 and the end portion 83 of the semiconductor chip 80 to be increased, and defects such as cracks of the solder layer 20 due to stress concentration can be reduced.

In the example of FIG. 5, the groove 32 is provided in the vicinity of the end portion 82 and the end portion 83 of the semiconductor chip 80. In the present example, the groove 32 overlaps the end portion 82 and the end portion 83 of the semiconductor chip 80 in a top view. The groove 32 is not provided in the vicinity of a center 84 of the semiconductor chip 80. The center 84 of the semiconductor chip 80 is the center of the semiconductor chip 80 in the XY plane. That is, the depth of the concave portion 18 immediately below the end portion 82 (or the end portion 83) of the semiconductor chip 80 in a top view is larger than the depth of the concave portion 18 immediately below the center 84 of the semiconductor chip 80 in a top view.

Figure 7:
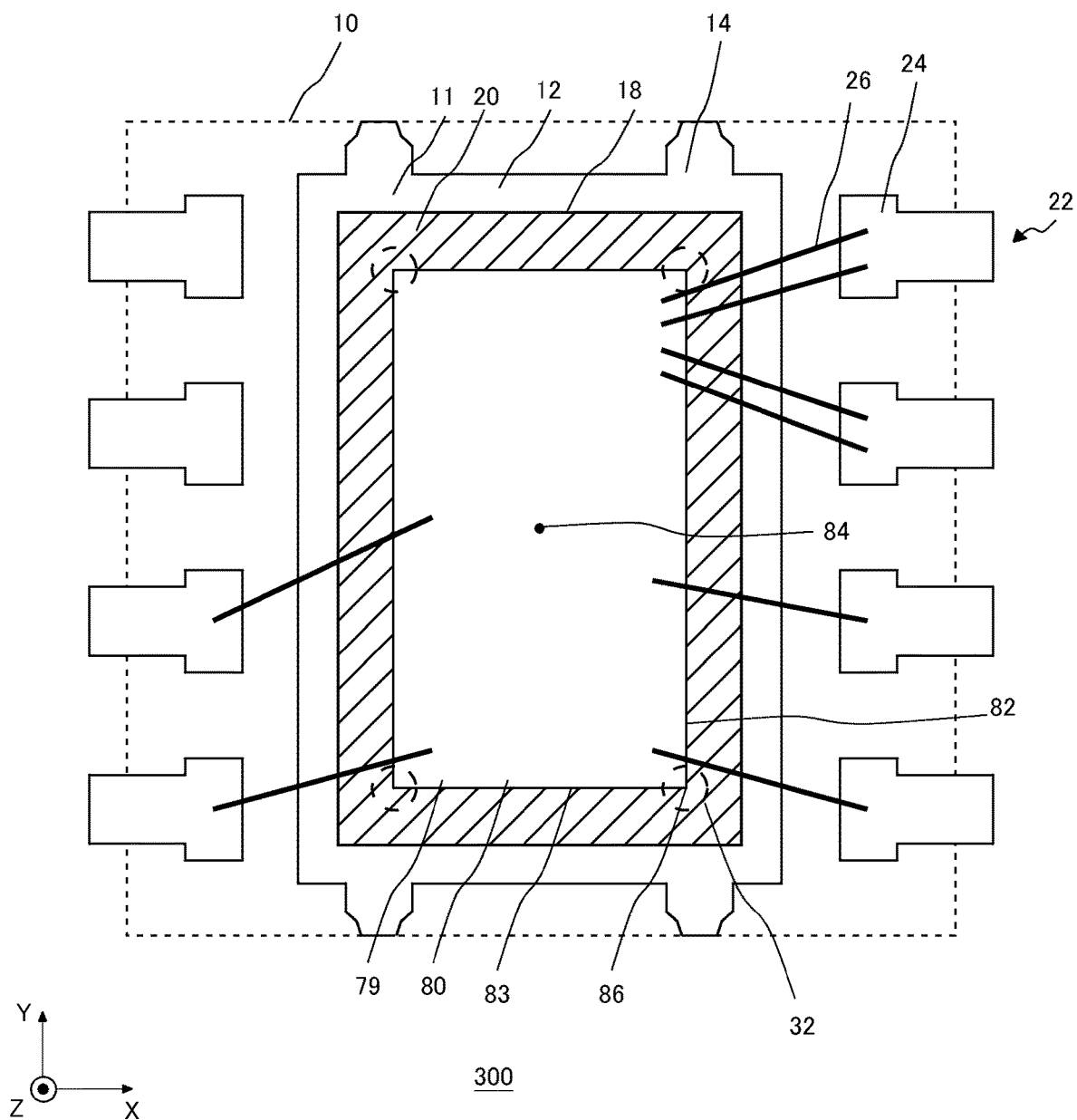
FIG. 7 is a top view illustrating an example of a semiconductor device 300 according to another embodiment of the present invention.

FIG. 7 is a top view illustrating an example of a semiconductor device 300 according to another embodiment of the present invention. The semiconductor device 300 of FIG. 7 is different from the semiconductor device 200 of FIG. 5 in the configuration of the groove 32. The other configurations of the semiconductor device 300 may be the same as those of the semiconductor device 200. In FIG. 7, the groove 32 is indicated by a dotted line.

In the example of FIG. 7, the groove 32 is provided only in the vicinity of a corner 86 of the semiconductor chip 80. The corner 86 of the semiconductor chip 80 is a portion where the end portion 82 of the semiconductor chip 80 in the X axis direction and the end portion 83 of the semiconductor chip 80 in the Y axis direction are connected. Also in FIG. 7, the groove 32 is not provided in the vicinity of the center 84 of the semiconductor chip 80. That is, the depth of the concave portion 18 immediately below the corner 86 of the semiconductor chip 80 in a top view is larger than the depth of the concave portion 18 immediately below the center 84 of the semiconductor chip 80 in a top view. Providing the groove 32 only in the vicinity of the corner 86 allows the lead frame 12 to be easily processed, and defects of the solder layer 20 due to stress concentration can be reduced.

Figure 8:
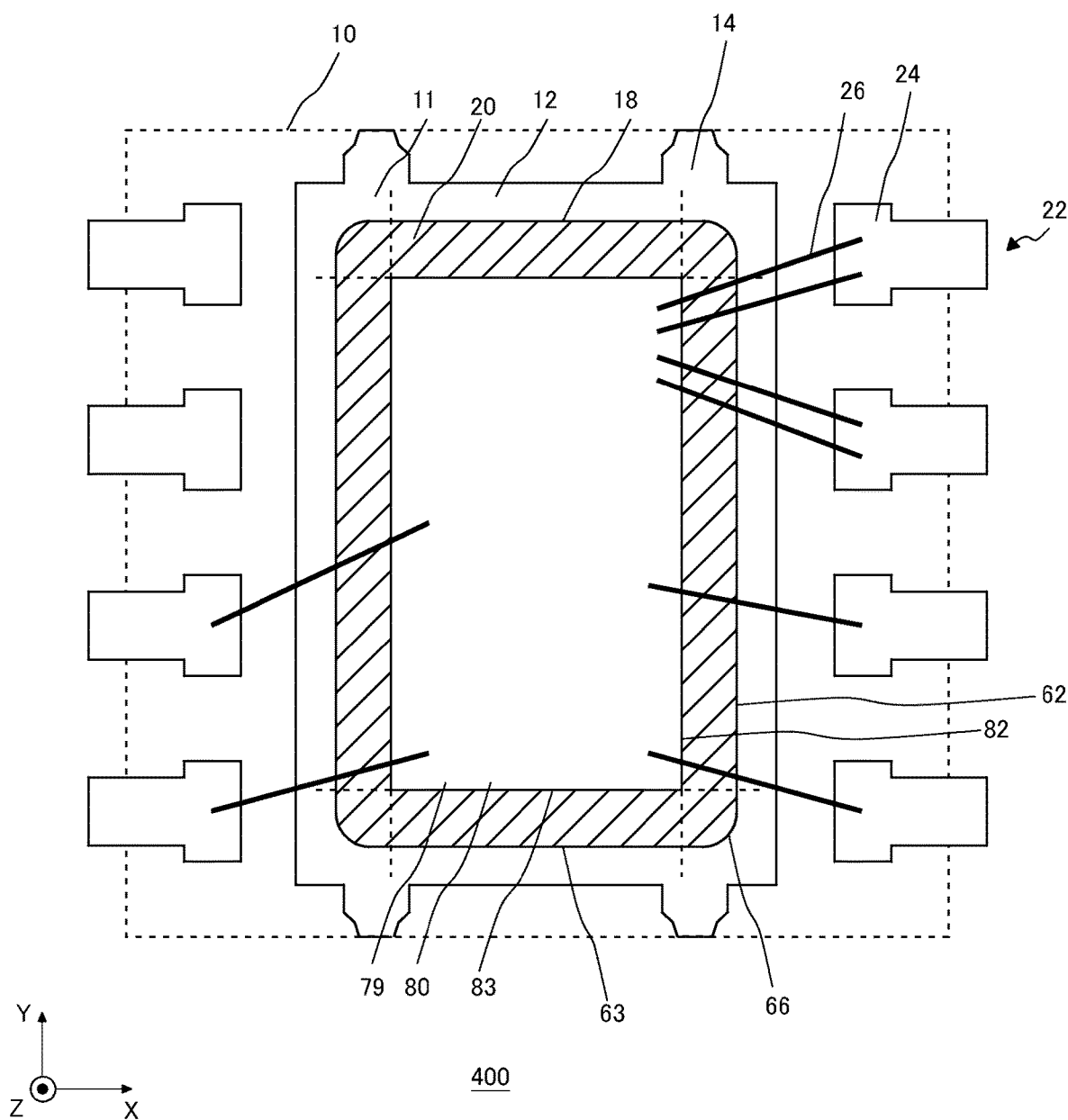
FIG. 8 is a top view illustrating an example of a semiconductor device 400 according to another embodiment of the present invention.

FIG. 8 is a top view illustrating an example of a semiconductor device 400 according to another embodiment of the present invention. The semiconductor device 400 of FIG. 8 is different from the semiconductor device 100 of FIG. 1 in that a corner 66 of the concave portion 18 has a curve in a top view. The other configurations of the semiconductor device 400 of FIG. 8 may be the same as those of the semiconductor device 100 of FIG. 1. The corner 66 of the concave portion 18 is a portion where an end side 62 of the concave portion 18 in the X axis direction and an end side 63 of the concave portion 18 in the Y axis direction are connected. Although not illustrated in FIG. 8, an end side 72, an end side 73, and the corner 76 of the convex portion 30 may substantially coincide with the end side 62, the end side 63, and the corner 66 of the concave portion 18.

Figure 9:
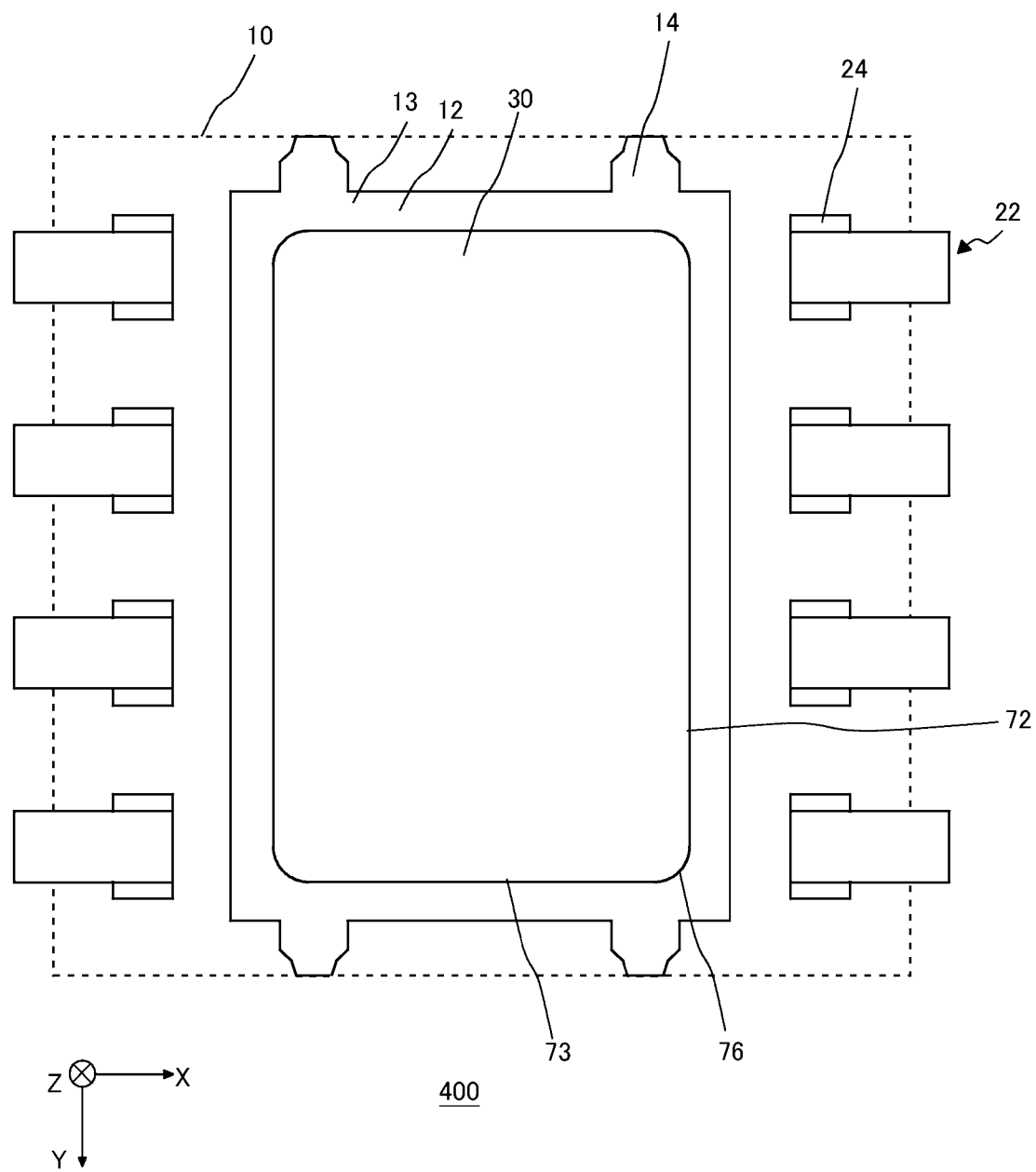
FIG. 9 is a bottom view illustrating an example of the semiconductor device 400.

FIG. 9 is a bottom view illustrating an example of the semiconductor device 400. The semiconductor device 400 of FIG. 9 is different from the semiconductor device 100 of FIG. 3 in that the corner 76 of the convex portion 30 has a curve in a bottom view. The other configurations of the semiconductor device 400 of FIG. 9 may be the same as those of the semiconductor device 100 of FIG. 3. The corner 76 of the convex portion 30 is a portion where the end side 72 of the convex portion 30 in the X axis direction and the end side 73 of the convex portion 30 in the Y axis direction are connected. Although not illustrated in FIG. 9, the end side 62, the end side 63, and the corner 66 of the concave portion 18 may substantially coincide with the end side 72, the end side 73, and the corner 76 of the convex portion 30.

Since the corner 66 of the concave portion 18 has a curve, the corner 76 of the convex portion 30 has a curve. Since the corner 76 of the convex portion 30 has a curve, a large amount of the sealing resin 10 can be provided in the vicinity of the corner 76 of the convex portion 30, and deformation of the lead frame 12 can be suppressed. Therefore, it is possible to reduce defects due to stress concentration in the lead frame 12.

Note that, in FIG. 8, a line obtained by extending the end portion 82 and the end portion 83 of the semiconductor chip 80 is indicated by a dotted line. In order to efficiently dissipate heat from the semiconductor chip 80, it is preferable that the semiconductor chip 80 and the sealing resin 10 of the lower surface 13 of the lead frame 12 are separated as much as possible in a top view. Therefore, it is preferable that the corner 66 of the concave portion 18 is not provided on a line obtained by extending the end portion 82 and the end portion 83 of the semiconductor chip 80.

Figure 10:
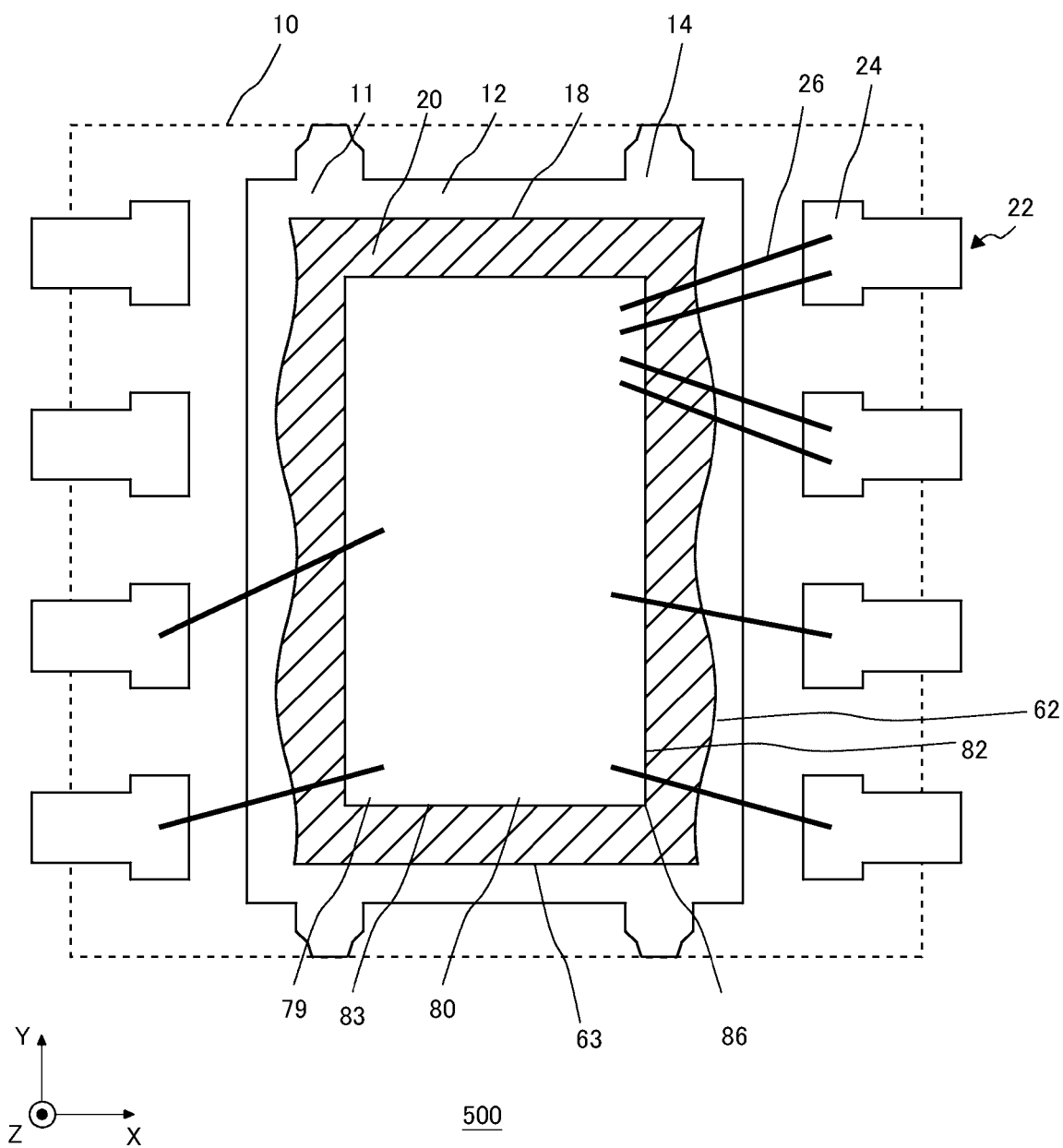
FIG. 10 is a top view illustrating an example of a semiconductor device 500 according to another embodiment of the present invention.

FIG. 10 is a top view illustrating an example of a semiconductor device 500 according to another embodiment of the present invention. The semiconductor device 500 of FIG. 10 is different from the semiconductor device 100 of FIG. 1 in that the end side 62 of the concave portion 18 has irregularities in a top view. The other configurations of the semiconductor device 500 of FIG. 10 may be the same as those of the semiconductor device 100 of FIG. 1. Although not illustrated in FIG. 10, the end side 72 and the end side 73 of the convex portion 30 may substantially coincide with the end side 62 and the end side 63 of the concave portion 18.

Figure 11:
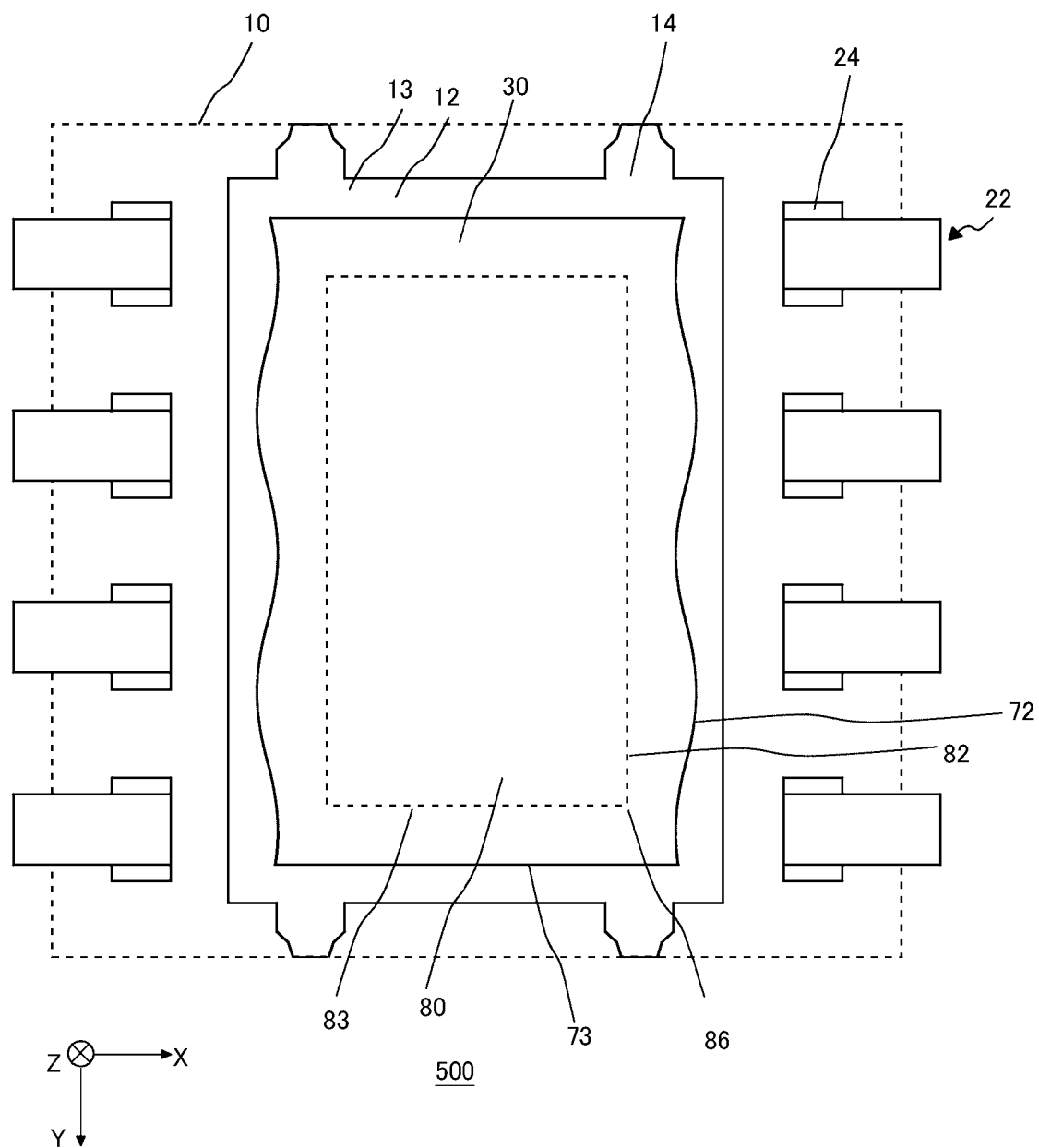
FIG. 11 is a bottom view illustrating an example of the semiconductor device 500.

FIG. 11 is a bottom view illustrating an example of the semiconductor device 500. The semiconductor device 500 of FIG. 11 is different from the semiconductor device 100 of FIG. 3 in that the end side 72 of the convex portion 30 has irregularities in a bottom view. The other configurations of the semiconductor device 500 of FIG. 11 may be the same as those of the semiconductor device 100 of FIG. 3. Although not illustrated in FIG. 11, the end side 62 and the end side 63 of the concave portion 18 may substantially coincide with the end side 72 and the end side 73 of the convex portion 30. In FIG. 11, the arrangement of the semiconductor chip 80 is indicated by a dotted line.

In the present example, the end side 62 of the concave portion 18 and the end side 72 of the convex portion 30 have irregularities. In FIG. 10 and FIG. 11, the end side 62 of the concave portion 18 and the end side 72 of the convex portion 30 have a wave shape. That is, the end side 62 of the concave portion 18 and the end side 72 of the convex portion 30 have a portion protruding in the X axis direction and a portion dented in the X axis direction. Since the end side 62 of the concave portion 18 and the end side 72 of the convex portion 30 have irregularities, the amount of the sealing resin 10 in the vicinity of the end side 62 of the concave portion 18 and in the vicinity of the end side 72 of the convex portion 30 can be adjusted.

In the present example, the end side 62 of the concave portion 18 and the end side 72 of the convex portion 30 protrude toward the semiconductor chip 80 side at a position facing the corner 86 of the semiconductor chip 80. Facing the corner 86 of the semiconductor chip 80 means to be provided at the same position as the corner 86 of the semiconductor chip 80 in the Y axis direction. Forming the end side 62 of the concave portion 18 and the end side 72 of the convex portion 30 to protrude toward the semiconductor chip 80 side in the vicinity of the corner 86 of the semiconductor chip 80 allows a large amount of the sealing resin 10 to be provided in the vicinity of the corner 86 of the semiconductor chip 80.

Figure 12:
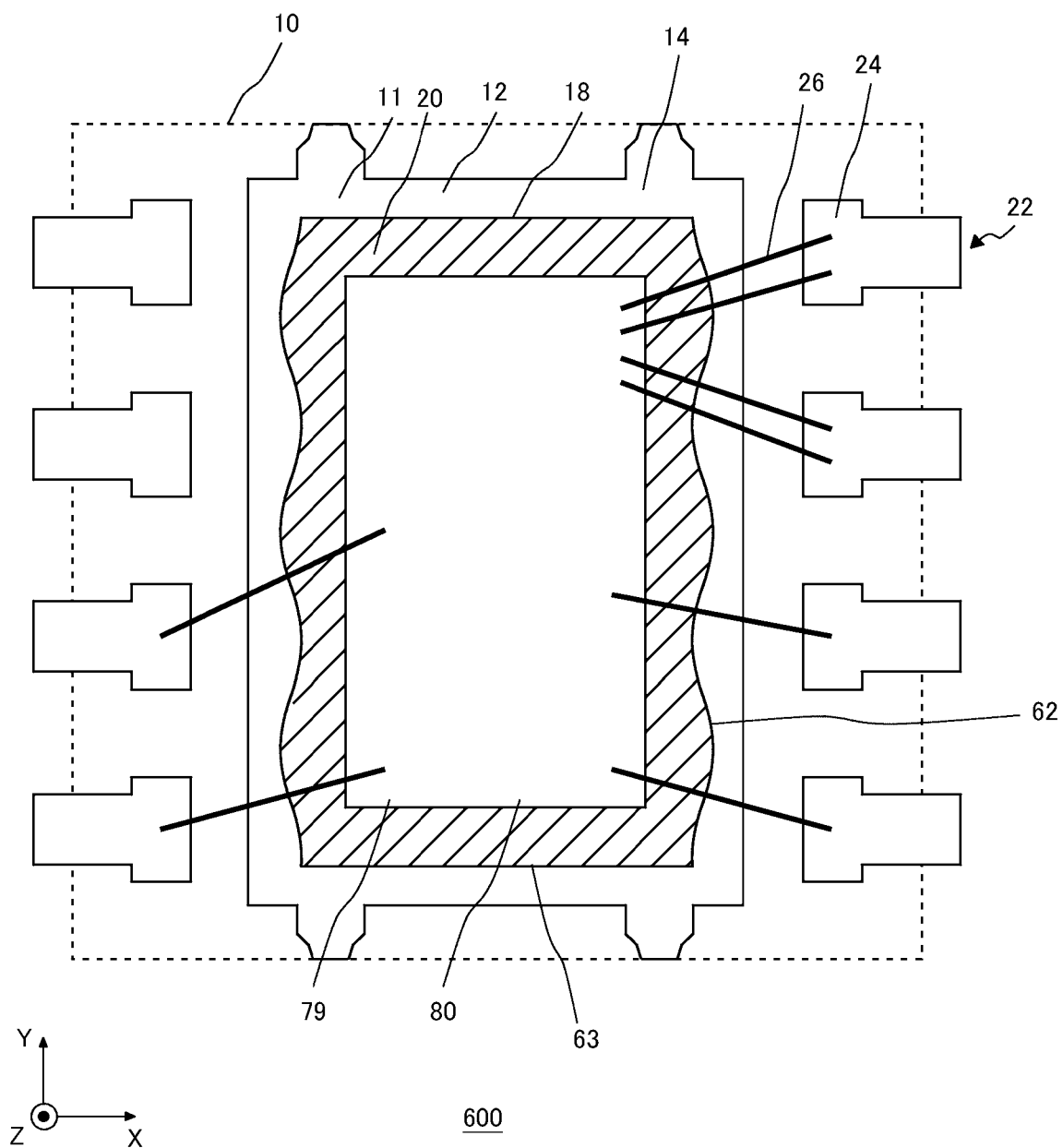
FIG. 12 is a top view illustrating an example of a semiconductor device 600 according to another embodiment of the present invention.

FIG. 12 is a top view illustrating an example of a semiconductor device 600 according to another embodiment of the present invention. The semiconductor device 600 of FIG. 12 is different from the semiconductor device 100 of FIG. 1 in that the end side 62 of the concave portion 18 has irregularities in a top view. The other configurations of the semiconductor device 600 of FIG. 12 may be the same as those of the semiconductor device 100 of FIG. 1. Although not illustrated in FIG. 12, the end side 72 and the end side 73 of the convex portion 30 may substantially coincide with the end side 62 and the end side 63 of the concave portion 18.

Figure 13:
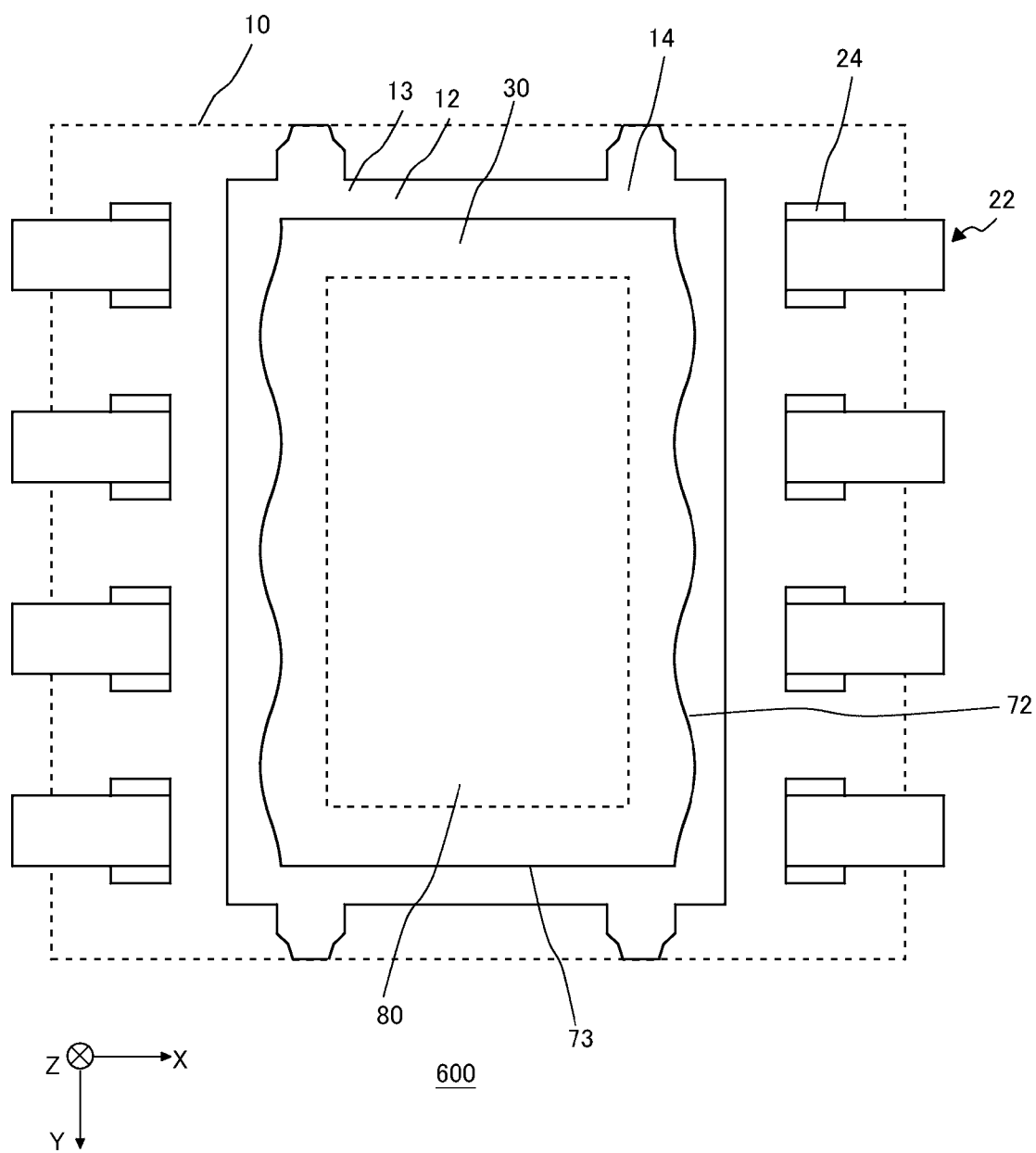
FIG. 13 is a bottom view illustrating an example of the semiconductor device 600.

FIG. 13 is a bottom view illustrating an example of the semiconductor device 600. The semiconductor device 600 of FIG. 13 is different from the semiconductor device 100 of FIG. 3 in that the end side 72 of the convex portion 30 has irregularities in a bottom view. The other configurations of the semiconductor device 600 of FIG. 13 may be the same as those of the semiconductor device 100 of FIG. 3. Although not illustrated in FIG. 13, the end side 62 and the end side 63 of the concave portion 18 may substantially coincide with the end side 72 and the end side 73 of the convex portion 30. In FIG. 13, the arrangement of the semiconductor chip 80 is indicated by a dotted line.

Also in the present example, the end side 62 of the concave portion 18 and the end side 72 of the convex portion 30 have irregularities. In FIG. 12 and FIG. 13, the end side 62 of the concave portion 18 and the end side 72 of the convex portion 30 protrude toward the semiconductor chip 80 side at a position facing the external terminal 22. Facing the external terminal 22 means to be provided at the same position as at least a part of the external terminal 22 in the Y axis direction. Forming the end side 62 of the concave portion 18 and the end side 72 of the convex portion 30 to protrude toward the semiconductor chip 80 side at the position facing the external terminal 22 allows a large amount of the sealing resin 10 to be provided in the vicinity of the position facing the external terminal 22.

Figure 14:
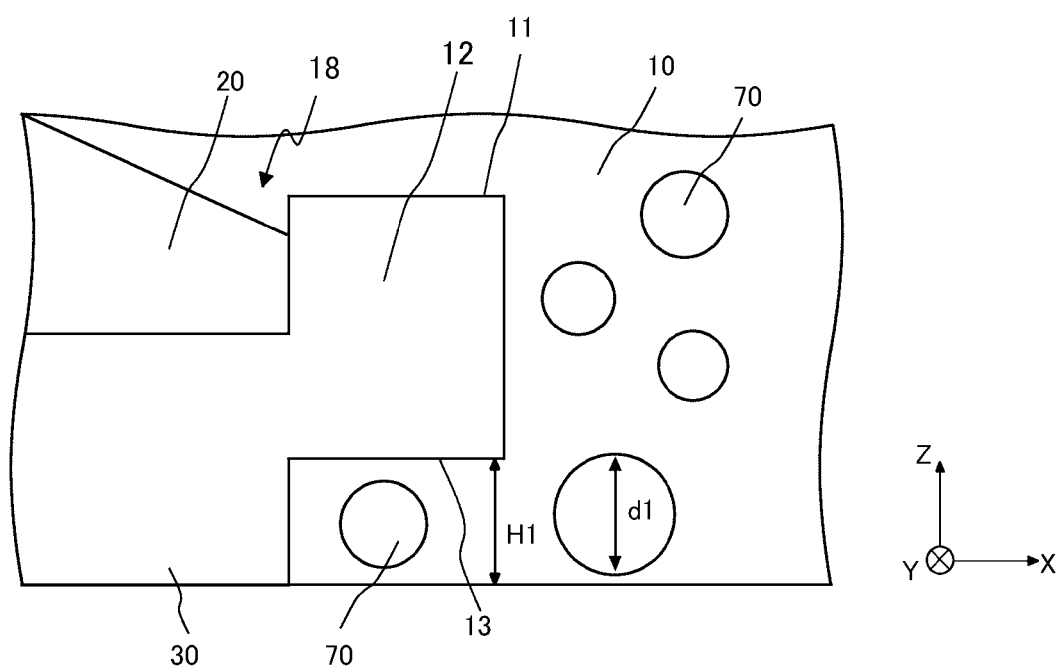
FIG. 14 is a diagram for explaining a sealing resin 10 in detail.

FIG. 14 is a diagram for explaining the sealing resin 10 in detail. In FIG. 14, the semiconductor device 100 includes the sealing resin 10, the lead frame 12, and the solder layer 20.

The sealing resin 10 has a filler 70. The filler is a so-called bulking agent. Since the sealing resin 10 has the filler 70, thermal characteristics and the like of the sealing resin 10 can be controlled. For example, when the sealing resin 10 contains the filler 70 in a predetermined amount or more, the glass transition temperature of the entire sealing resin 10 can be increased, and the heat resistance can be increased. The filler 70 is an inorganic filler such as a silica filler containing $SiO_2$ as an example The filler 70 may occupy half or more of the total volume of the sealing resin 10.

As illustrated in FIG. 14, the filler 70 has various particle diameters d1. The particle diameter d1 of the filler 70 is 75 μm or less as an example The maximum particle diameter of the filler 70 may be 75 μm or less. The maximum particle diameter of the filler 70 being 75 μm or less may mean that $μ+3σ$ is 75 μm or less, where an average value of measured values when the particle diameter d1 of the filler 70 is measured is μ, and a standard deviation is σ.

In FIG. 14, the filler 70 is provided below the lead frame 12 in a region where the convex portion 30 is not provided. Providing the filler 70 in the region where the convex portion 30 is not provided allows the filler 70 to be uniformly provided over the entire sealing resin 10. Therefore, characteristics such as thermal characteristics of the sealing resin 10 can be made uniform. The height H1 of the convex portion 30 may be larger than the particle shape d1 of the filler 70. The fact that the height H1 of the convex portion 30 is larger than the particle diameter d1 of the filler 70 may mean that $μ+3σ$ is smaller than the height H1 of the convex portion 30, where an average value of measured values when the particle diameter d1 of the filler 70 is measured is μ and a standard deviation is σ.

The filler 70 is preferably provided below the protrusion 24 described with reference to FIG. 4. Providing the filler 70 below the protrusion 24 allows the filler 70 to be uniformly provided over the entire sealing resin 10. Therefore, characteristics such as thermal characteristics of the sealing resin 10 can be made uniform.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
    a lead frame having an upper surface provided with a concave portion and a lower surface provided with a convex portion;
    a semiconductor chip fixed to the upper surface of the lead frame;
    a solder layer provided in the concave portion and fixing the semiconductor chip to the upper surface of the lead frame; and
    a sealing resin for sealing the semiconductor chip and the lead frame, wherein
    a thickness of the solder layer is larger than a depth of the concave portion,
    the sealing resin covers at least a part of the lower surface of the lead frame,
    at least a part of the convex portion of the lead frame is exposed from the sealing resin,
    the solder layer contacts a side of the concave portion and does not contact a side of the semiconductor chip, and
    a fillet of the solder layer extends from a bottom surface of the semiconductor chip to a side of a recess.

2. The semiconductor device according to claim 1, wherein
    a depth of the concave portion immediately below an end portion of the semiconductor chip in a top view is larger than a depth of the concave portion immediately below a center of the semiconductor chip in a top view.

3. The semiconductor device according to claim 2, wherein
    a depth of the concave portion immediately below a corner of the semiconductor chip in a top view is larger than a depth of the concave portion immediately below a center of the semiconductor chip in a top view.

4. The semiconductor device according to claim 3, further comprising:
    an external terminal connected to the semiconductor chip, wherein
    the external terminal has a protrusion protruding in a top view.

5. The semiconductor device according to claim 2, wherein
    a corner of the concave portion has a curve in a top view.

6. The semiconductor device according to claim 2, further comprising:
an external terminal connected to the semiconductor chip, wherein
the external terminal has a protrusion protruding in a top view.

7. The semiconductor device according to claim 2, wherein
a height of the convex portion is equal to or less than a depth of the concave portion.

8. The semiconductor device according to claim 2, wherein
the sealing resin has a filler, and
the filler is provided below the lead frame in a region where the convex portion is not provided.

9. The semiconductor device according to claim 1, wherein
a depth of the concave portion immediately below a corner of the semiconductor chip in a top view is larger than a depth of the concave portion immediately below a center of the semiconductor chip in a top view.

10. The semiconductor device according to claim 9, wherein
a corner of the concave portion has a curve in a top view.

11. The semiconductor device according to claim 9, further comprising:
an external terminal connected to the semiconductor chip, wherein
the external terminal has a protrusion protruding in a top view.

12. The semiconductor device according to claim 1, wherein
a corner of the concave portion has a curve in a top view.

13. The semiconductor device according to claim 1, wherein
an end side of the convex portion in a top view has irregularities.

14. The semiconductor device according to claim 13, wherein
the end side of the convex portion protrudes toward the semiconductor chip side at a position facing a corner of the semiconductor chip.

15. The semiconductor device according to claim 14, further comprising:
an external terminal electrically connected to the semiconductor chip, wherein
an end side of the convex portion protrudes toward the semiconductor chip side at a position facing the external terminal.

16. The semiconductor device according to claim 13, further comprising:
an external terminal electrically connected to the semiconductor chip, wherein
an end side of the convex portion protrudes toward the semiconductor chip side at a position facing the external terminal.

17. The semiconductor device according to claim 1, further comprising:
an external terminal connected to the semiconductor chip, wherein
the external terminal has a protrusion protruding in a top view.

18. The semiconductor device according to claim 17, wherein
the external terminal is provided at a position lower than the semiconductor chip in a height direction.

19. The semiconductor device according to claim 1, wherein
a height of the convex portion is equal to or less than a depth of the concave portion.

20. The semiconductor device according to claim 1, wherein
the sealing resin has a filler, and
the filler is provided below the lead frame in a region where the convex portion is not provided.

21. The semiconductor device according to claim 1, wherein
the solder layer is provided in an entire bottom surface of the concave portion.

22. The semiconductor device according to claim 1, wherein
an entirety of the semiconductor chip is provided above the lead frame in a height direction.

23. The semiconductor device according to claim 1, further comprising:
a groove formed in the concave portion in a vicinity of a plurality of end portions of the semiconductor chip.

* * * * *